United States Patent
Yamada

(10) Patent No.: US 6,809,688 B2
(45) Date of Patent: Oct. 26, 2004

(54) RADIO COMMUNICATION DEVICE WITH INTEGRATED ANTENNA, TRANSMITTER, AND RECEIVER

(75) Inventor: Atsushi Yamada, Tenri (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/312,681

(22) PCT Filed: Jun. 15, 2001

(86) PCT No.: PCT/JP01/05102

§ 371 (c)(1),
(2), (4) Date: Dec. 30, 2002

(87) PCT Pub. No.: WO02/03499

PCT Pub. Date: Jan. 10, 2002

(65) Prior Publication Data

US 2003/0103006 A1 Jun. 5, 2003

(30) Foreign Application Priority Data

Jun. 30, 2000 (JP) ..................................... 2000-198033

(51) Int. Cl.[7] .............................................. H01Q 1/38
(52) U.S. Cl. ............................... 343/700 MS; 343/846; 455/297
(58) Field of Search .......................... 343/700 MS, 853, 343/846; 342/422, 423, 359; 455/269, 297; H01Q 1/38

(56) References Cited

U.S. PATENT DOCUMENTS

| | | | | |
|---|---|---|---|---|
| 4,477,813 A | * | 10/1984 | Weiss ................... | 343/700 MS |
| 5,400,039 A | * | 3/1995 | Araki et al. .......... | 343/700 MS |
| 5,561,435 A | * | 10/1996 | Nalbandian et al. . | 343/700 MS |
| 6,208,220 B1 | * | 3/2001 | Logothetis ............. | 333/116 |

FOREIGN PATENT DOCUMENTS

| | | | | |
|---|---|---|---|---|
| JP | 63-50202 A | 3/1988 | ......... | H01Q/13/16 |
| JP | 1-147905 A | 6/1989 | ......... | H01Q/13/08 |
| JP | 6-152237 A | 5/1994 | ......... | H01Q/23/00 |
| JP | 6-196924 A | 7/1994 | ......... | H01Q/13/10 |
| JP | 6-232627 A | 8/1994 | ......... | H01Q/13/08 |
| JP | 8-250913 A | 9/1996 | ............ | H01P/5/08 |
| JP | 9-51224 A | 2/1997 | ......... | H01Q/13/08 |
| JP | 9-237867 A | 9/1997 | ......... | H01L/25/00 |
| JP | 2001-28413 A | 1/2001 | ......... | H01L/23/12 |
| JP | 2001-127530 A | 5/2001 | ......... | H01Q/13/08 |

OTHER PUBLICATIONS

Amano, Y. et al., "Multi-Layered Substrates for Wireless Communication Modules at 60GHz", 29th European Microwave Conference–Munich, (1999).

* cited by examiner

*Primary Examiner*—Hoanganh Le
*Assistant Examiner*—Trinh Vo Dinh
(74) *Attorney, Agent, or Firm*—Birch, Stewart, Kolasch & Birch, LLP.

(57) ABSTRACT

A dielectric multilayer substrate 220 is formed by laminating first through third dielectric layers 201 through 203. A plurality of conductor patches 204a through 204d are arranged on the upper surface of the first dielectric layer 201, and a microstrip line 205 for antenna feeding is arranged between the first and second dielectric layers. A ground layer 206 is arranged between the second and third dielectric layers 202 and 203, and microstrip lines 208a and 208b for a high-frequency circuit are arranged on the lower surface of the third dielectric layer 203. The microstrip line 205 for antenna feeding and the microstrip line 208a for the high-frequency circuit are electromagnetically coupled with each other via a slot hole 207 provided for the ground layer 206. With this arrangement, the efficiency and directivity of the antenna are improved.

10 Claims, 13 Drawing Sheets

RADIO COMMUNICATION DEVICE WITH INTEGRATED ANTENNA, TRANSMITTER, AND RECEIVER

This application is the national phase under 35 U.S.C. § 371 of PCT International Application No. PCT/JP01/05102 which has an International filing date of Jun. 15, 2001, which designated the United States of America.

TECHNICAL FIELD

The present invention relates to an antenna-integrated radio communication device, transmitter and receiver provided with an antenna function to be used for microwave communications.

BACKGROUND ART

Recently, in accordance with improvements in the processing speed of information processing apparatuses, developments in resolution of image processing apparatuses and so on, attention has been paid to high-speed large-capacity personal communications at high frequencies of microwaves and the like. Particularly, in the milliwave band, power loss in the connection portions of an antenna and a high-frequency circuit becomes increased, and therefore, it is attempted to develop an antenna-integrated radio communication device in which an antenna is integrated with a high-frequency circuit.

As an antenna-integrated radio communication device, there is the one disclosed in Japanese Patent Laid-Open Publication No. HEI 9-237867. As shown in FIG. 8, this antenna-integrated radio communication device includes an antenna circuit substrate A in which an antenna element 3 and a high-frequency line 4 for feeding the antenna element 3 are formed on a first dielectric substrate 2 and a high-frequency device circuit substrate B in which a high-frequency device 9 is housed in a cavity 8 formed in a part of a second dielectric substrate 7 and sealed with a lid member 10 and a transmission line 11 for transmitting a signal to the high-frequency device 9 is formed. The antenna circuit substrate A and the device circuit substrate B are laminated and integrated with each other, and the high-frequency line 4 of the antenna circuit substrate A and the transmission line 11 of the high-frequency device circuit substrate B are electromagnetically coupled and connected with each other via a slot 6.

Moreover, as another antenna-integrated radio communication device, there is the one described in Japanese Patent Laid-Open Publication No. HEI 8-250913. As shown in FIG. 9, this antenna-integrated radio communication device includes a base 41 constructed of upper and lower dielectric layers 41a and 41b and a ground layer 41c placed between the dielectric layers 41a and 41b, and the ground layer 41c is provided with a slot portion 41d. Moreover, a flat antenna 41e is formed on the lower surface of a package 3 that seals and houses a semiconductor integrated circuit, and a microstrip line 91 for feeding is formed on the package inner surface side of the upper dielectric layer 41a. Then, this microstrip line 91 is electrically connected to an output terminal 2a and an input terminal 93 of an MMIC (Monolithic Microwave Integrated Circuit) 92 with bonding wires 2b and 94.

In the antenna-integrated radio communication device shown in FIG. 8, ground layers 5 and 12 exist above and below the high-frequency line 4 that feeds the antenna element 3. Therefore, the upper and lower ground layers 5 and 12 do not become equipotential particularly at very high frequencies as in the milliwave band, and electric power is converted into unnecessary electromagnetic waves in a parallel plate mode to propagate between the upper and lower ground layers 5 and 12, loosing the electric power from substrate end surfaces. As a method for restraining this unnecessary mode, there can be considered a method for equalizing the potentials of the two ground layers by connecting the upper and lower ground layers via a lot of through holes. However, inductance of the through holes becomes unignorable as the frequency becomes higher, and therefore, this method has a limitation. As a result of the generation of electromagnetic waves in the unnecessary mode described above, there is a problem that the efficiency of the antenna element 3 is reduced. Moreover, if substrate materials of different material properties are laminated in the antenna-integrated radio communication device, there is a problem that the semiconductor chip mounting reliability is degraded due to the manufacturing problems such as lamination displacement and exfoliation and the warp of the substrates because of differences in the thermal expansion coefficient between them.

Moreover, in the antenna-integrated radio communication device shown in FIG. 9, in order to form an array of flat antennas 41e, it is required to branch the feeding microstrip line 91 to feed each flat antenna 41e and house the feeding microstrip line 91 in the same package as that of the MMIC 92. However, unnecessary electromagnetic waves radiated from the feeding microstrip line 91 and the MMIC 92 exert adverse influences on them, possibly causing not only a reduction in efficiency but also malfunction.

As described above, it has been difficult for the conventional antenna-integrated radio communication devices shown in FIG. 8 and FIG. 9 to concurrently satisfy the antenna efficiency, the directivity of the formed array and the semiconductor chip mounting reliability.

DISCLOSURE OF THE INVENTION

Accordingly, the object of the present invention is to provide an antenna-integrated radio communication device capable of improving the efficiency and directivity of the antenna, improving the semiconductor chip mounting reliability with restrained warp of the substrate and preventing the malfunctioning of the high-frequency circuit as well as a transmitter and a receiver employing the communication device.

In order to achieve the aforementioned object, the present invention provides an antenna-integrated radio communication device having a dielectric multilayer substrate in which a plurality of dielectric layers are laminated and a high-frequency circuit on which semiconductor chips are mounted, wherein a plurality of conductor patches, an antenna feeder line for feeding the plurality of conductor patches, one ground layer and the high-frequency circuit connected to the antenna feeder line are separately arranged on an upper surface, between layers and on a lower surface, respectively, of the dielectric multilayer substrate, and the one ground layer is arranged between an antenna section comprised of the plurality of conductor patches and the antenna feeder line and the high-frequency circuit.

According to the antenna-integrated radio communication device of the above-mentioned construction, the plurality of conductor patches, the antenna feeder line, the ground layer and the high-frequency circuit are separately arranged on the upper surface, between the layers and on the lower surface, respectively, of the dielectric multilayer substrate, and the ground layer is arranged between the antenna section constructed of the plurality of conductor patches and the antenna feeder line, and the high-frequency circuit. With this arrangement, the antenna section and the high-frequency circuit are spatially separated from each other by the ground layer, and therefore, the mutual adverse influences of the antenna circuit and the high-frequency circuit can be eliminated. Moreover, the ground layer is only one layer, and therefore, the antenna feeder line becomes able to perform the transmission in the desired quasi-TEM mode even at a high frequency in the milliwave band. Therefore, the efficiency and directivity of the antenna can be improved, and the high-frequency circuit can be prevented from malfunctioning. Furthermore, the plurality of conductor patches and the antenna feeder line are formed in different layers, and therefore, the efficiency of the antenna and the characteristics of the antenna feeder line can be independently optimized.

Moreover, in one embodiment, the dielectric multilayer substrate is a dielectric multilayer substrate comprised of a first dielectric layer, a second dielectric layer and a third dielectric layer, the plurality of conductor patches are arranged on an upper surface of the first dielectric layer of the dielectric multilayer substrate, the antenna feeder line is arranged between the first dielectric layer and the second dielectric layer, the ground layer is arranged between the second dielectric layer and the third dielectric layer, the high-frequency circuit is arranged on a lower surface of the third dielectric layer of the dielectric multilayer substrate, and the antenna feeder line is electromagnetically coupled with the high-frequency circuit via a slot hole provided for the ground layer.

According to the antenna-integrated radio communication device of the above-mentioned embodiment, the dielectric multilayer substrate has the plurality of conductor patches provided on its upper surface, the antenna feeder line provided between the first and second dielectric layers, the ground layer provided between the second and third dielectric layers and the high-frequency circuit provided on the lower surface, and the antenna feeder line is electromagnetically coupled with the high-frequency circuit via the slot hole provided for the ground layer. This allows the obtainment of an optimum structure capable of easily improving the efficiency and directivity of the antenna and preventing the high-frequency circuit from malfunctioning.

Moreover, in one embodiment, the plurality of conductor patches are arranged in an array form, the antenna feeder line is branched into a plurality of lines, and the plurality of conductor patches and end portions of the branches of the antenna feeder line overlap each other.

According to the above-mentioned embodiment, the directivity of the antenna can be efficiently improved with the plurality of conductor patches arranged in an array form and the end portions of the branches of the antenna feeder line overlapping the patches.

Moreover, in one embodiment, a distance in a lengthwise direction of the antenna feeder line in a region where the plurality of conductor patches and the end portions of the branches of the antenna feeder line overlap each other is approximately a quarter of an effective wavelength of a prescribed electromagnetic wave.

According to the antenna-integrated radio communication device of the above-mentioned embodiment, the distance in the lengthwise direction of the antenna feeder line in the region where the plurality of conductor patches and the end portions of the branches of the antenna feeder line overlap each other is approximately a quarter of the effective wavelength of the prescribed electromagnetic wave. With this structure, loss due to reflections on the end portions of the antenna feeder line can be reduced, enabling the efficient feeding of each conductor patch from the antenna feeder line.

Moreover, in one embodiment, the dielectric layers of the dielectric multilayer substrate are formed by integrally baking a ceramic material that has a relative dielectric constant of 4 to 10.

According to the above-mentioned embodiment, by forming the dielectric layer of the dielectric multilayer substrate by the integral baking of the ceramic material that has a relative dielectric constant of 4 to 10, the structure of the dielectric multilayer substrate can be accurately provided. Moreover, strong substrate strength can be obtained by the use of the ceramic material, and the warp of the substrate is restrained, allowing the semiconductor chip mounting reliability to be improved.

Moreover, this invention provides an antenna-integrated radio communication device, wherein a plurality of conductor patches, an antenna feeder line, a ground layer and a high-frequency circuit are provided in order from an upper surface to a lower surface of the dielectric multilayer substrate on the upper surface, between layers and on the lower surface, respectively, of the dielectric multilayer substrate in which three dielectric layers are laminated.

According to the antenna-integrated radio communication device of the above-mentioned construction, the antenna section constructed of the plurality of conductor patches and the antenna feeder line, and the high-frequency circuit are spatially separated from each other by the ground layer, and therefore, the mutual adverse influences of the antenna section and the high-frequency circuit can be eliminated. Moreover, the ground layer is only one layer, and therefore, the antenna feeder line can perform transmission in the desired quasi-TEM mode even at a high frequency in the milliwave band. Therefore, the efficiency and directivity of the antenna can be improved, and the high-frequency circuit can be prevented from malfunctioning. Furthermore, the plurality of conductor patches and the antenna feeder line are formed on different layers, and therefore, the efficiency of the antenna and the characteristics of the antenna feeder line can be independently optimized.

Moreover, in one embodiment, each dielectric layer of the dielectric multilayer substrate has a thickness of 100 microns to 200 microns.

According to the above-mentioned embodiment, by making each dielectric layer of the dielectric multilayer substrate have a thickness of not greater than 200 microns, it is enabled to perform transmission in the desired quasi-TEM mode between the microstrip line used for the antenna feeder line and the ground layer at a frequency of, for example, 60 GHz when the dielectric layer has a relative dielectric constant of 4 to 10. If the thickness of each dielectric layer exceeds 200 microns, then the transmission loss of the microstrip line used for the antenna feeder line is increased. When the thickness of each dielectric layer is not greater than 100 microns, the interval between the conductor patch and the ground layer becomes narrow, and this reduces the antenna radiation efficiency and reduces the strength of the dielectric multilayer substrate.

Moreover, this invention provides a transmitter and a receiver employing the above antenna-integrated radio communication device.

According to the transmitter and the receiver of the above-mentioned construction, the transmitter and the receiver can be downsized. Moreover, by virtue of the formation of the antenna section and the high-frequency circuit on the upper and lower surfaces, respectively, of the dielectric substrate, signal loss between the antenna section and the high-frequency circuit can be reduced, and the communication distance can be increased without increasing the consumption power.

BEST MODE FOR CARRYING OUT THE INVENTION

Figure 1:
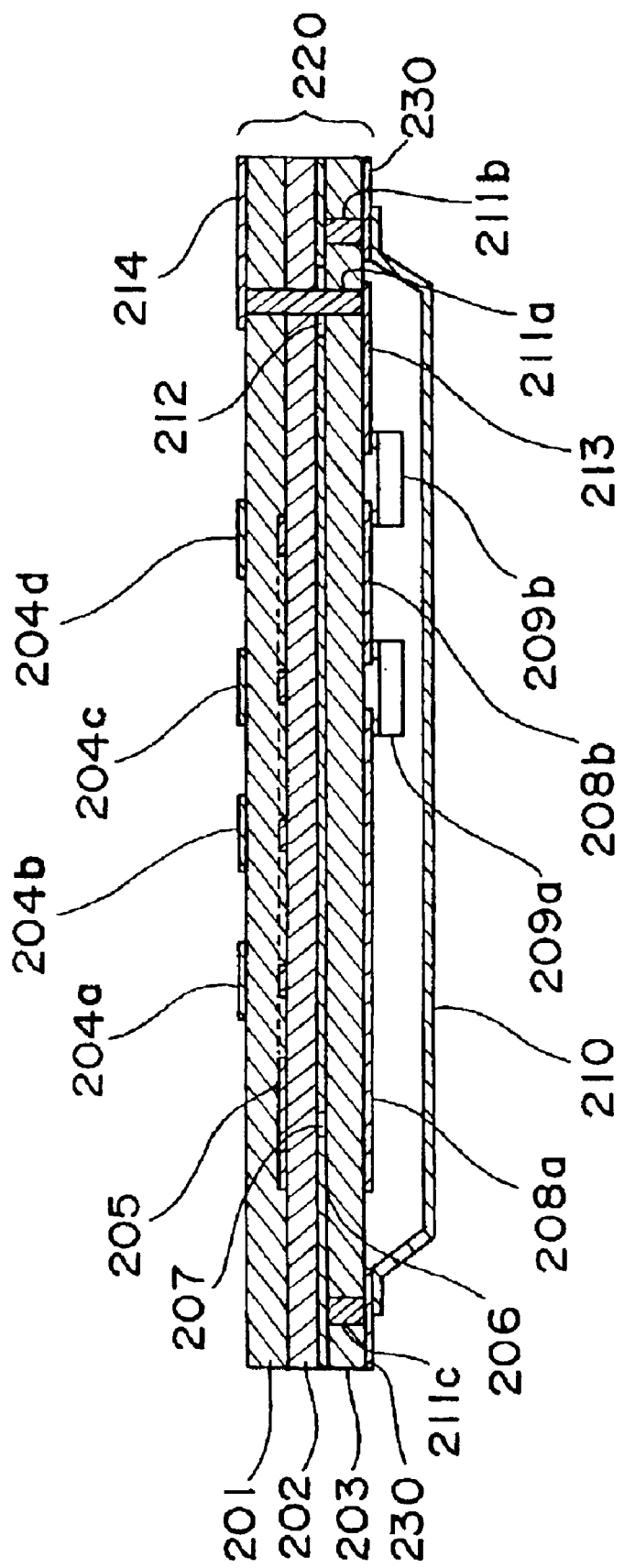
FIG. 1 is a sectional view of an antenna-integrated radio communication device according to a first embodiment of this invention.

The antenna-integrated radio communication device, transmitter and receiver of this invention will be described in detail below on the basis of the embodiments shown in the drawings.

(First Embodiment)

FIG. 1 is a sectional view showing the structure of the antenna-integrated radio communication device of the first embodiment of this invention. As shown in FIG. 1, this antenna-integrated radio communication device includes a dielectric multilayer substrate 220 that has a first dielectric layer 201, a second dielectric layer 202 and a third dielectric layer 203, which are laminated together. A plurality of conductor patches 204a through 204d (only the four are shown in FIG. 1) are formed in an array form on the upper surface of the first dielectric layer 201, forming a microstrip line 205 for antenna feeding between the first dielectric layer 201 and the second conductor layer 202. Moreover, a ground layer 206 is formed between the second dielectric layer 202 and the third conductor layer 203, and a slot hole 207 is formed in the ground layer 206. Moreover, microstrip lines 208a and 208b for a high-frequency circuit are formed on the surface of the third dielectric layer 203, and MMIC's 209a and 209b, which are semiconductor chips, are mounted on the microstrip lines 208a and 208b for the high-frequency circuit. Then, the microstrip lines 208a and 208b for the high-frequency circuit and the MMIC's 209a and 209b are covered with a conductor lid 210.

Moreover, the ground layer 206 is connected to the conductor lid 210 via through holes 211b and 211c and a connection portion 230. Moreover, one end of a low-frequency signal line 213 is connected to the MMIC 209b, and a port 214 formed on the upper surface of the first dielectric layer 201 is connected to the other end of the low-frequency signal line 213 via a through hole 211a. A clearance hole 212 through which the through hole 211a penetrates is provided for the ground layer 206.

The microstrip line 205 for antenna feeding is electromagnetically coupled with the microstrip line 208a for the high-frequency circuit via the slot hole 207 opened on the ground layer 206. Moreover, the microstrip line 205 for antenna feeding is electromagnetically coupled with the conductor patches 204a through 204d via the first dielectric layer 201.

By arranging the plurality of conductor patches 204a through 204d in an array form, an antenna function of an improved directivity can easily be obtained.

Figure 2:
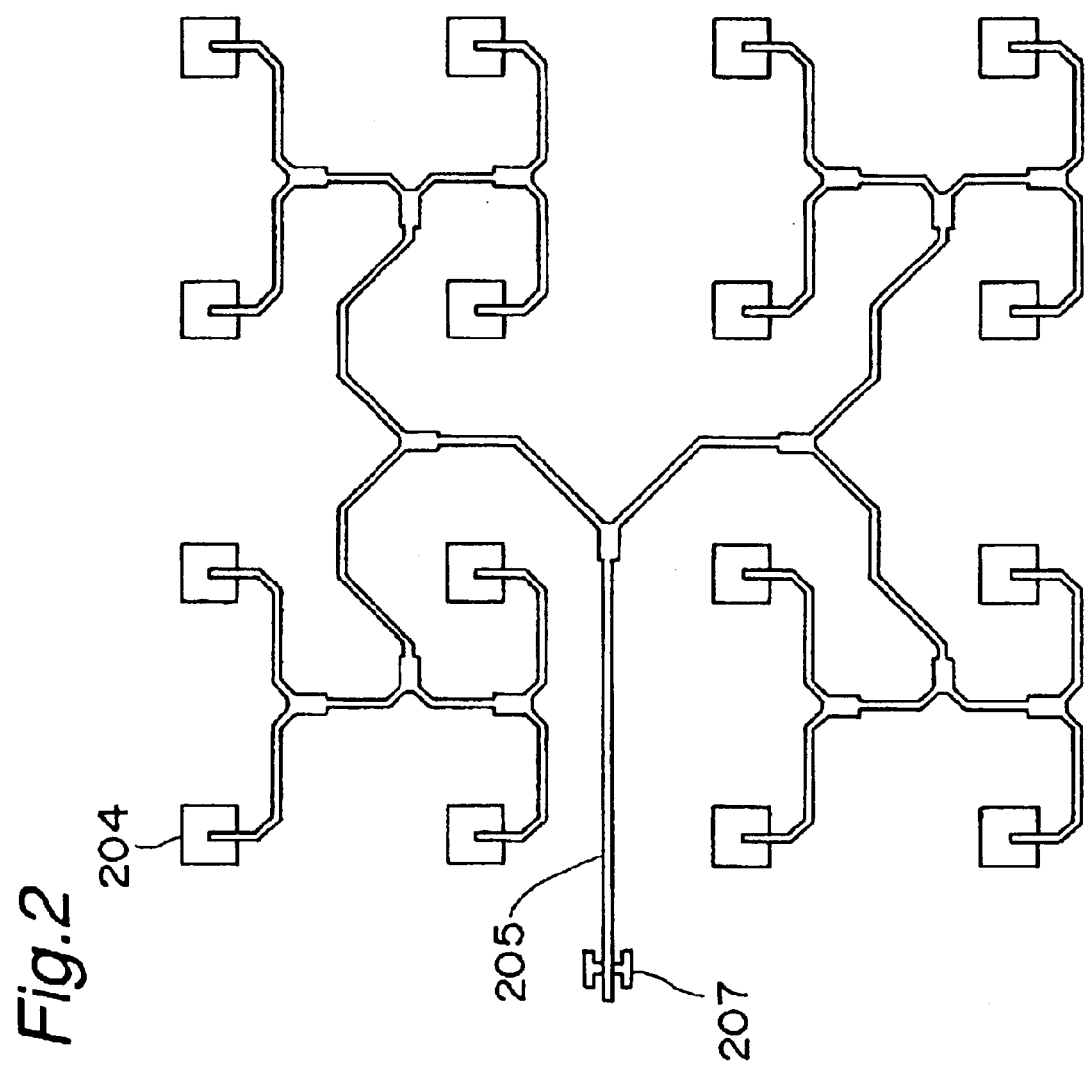
FIG. 2 is a view showing the positional relation between conductor patches and an antenna feeding microstrip line of the above antenna-integrated radio communication device.

For example, FIG. 2 is a schematic view showing the positional relation of the conductor patches 204 and the microstrip line 205 for antenna feeding when 16-element conductor patches 204 are arranged in an array form in the aforementioned antenna-integrated radio communication device. A method for branching the microstrip line 205 for antenna feeding is similar to the conventional method, and no description is provided therefor herein.

The functions of a transmitter that employs the antenna-integrated radio communication device of the aforementioned construction will be described next.

In FIG. 1, a low-frequency signal inputted to the port 214 is subjected to the processes of frequency conversion, amplification and so on by the MMIC's 209a and 209b. Then, a high-frequency signal outputted from the MMIC 209a passes through the microstrip line 208a for the high-frequency circuit and is transmitted to the microstrip line 205 for antenna feeding via the slot hole 207 and transmitted to the leading end portion of the microstrip line 205 for antenna feeding. The leading end portion of the microstrip line 205 for antenna feeding is electromagnetically coupled with the conductor patches 204 via the first dielectric layer 201, and therefore, the high-frequency signal is transmitted to each of the conductor patches 204. Then, the high-frequency signal resonates on the surface of the conductor patches 204a through 204d, and a large current flows to radiate electromagnetic waves into the space.

The functions of the transmitter that emits radiation from the conductor patches 204a through 204d have been described above. However, the antenna section has same directivity and efficiency by a reversible action also when an input wave is received from the space, it is also possible to constitute a receiver by changing the MMIC construction. It is to be noted that the microstrip lines 208a and 208b for the high-frequency circuit include passive circuits such as a matching circuit and a filter (not shown).

Generally, in the microstrip line, part of the electromagnetic waves that propagate in the quasi-TEM mode is converted into an unnecessary TM mode as the frequency becomes higher, and this is radiated from the edges of the dielectric multilayer substrate to increase the loss. Accordingly, it is required to provide a reduced interval between the transmission line and ground in order to perform transmission in the quasi-TEM mode. In the case of a high-frequency signal at a frequency of, for example, 60 GHz, if the interval between the microstrip line and the ground layer is not greater than 200 microns with the dielectric layer having a relative dielectric constant of 4 to 10, then the transmission can be regarded as the transmission in the desired quasi-TEM mode. In the case of a patch antenna in which a plurality of conductor patches are arranged in an array form, the radiation efficiency significantly deteriorates when the interval between each conductor patch and the ground layer is narrow. The higher the dielectric constant of the dielectric substance is, the further this becomes significant. When a dielectric layer having a relative dielectric constant of about 4 to 10 is employed, the interval between each conductor patch and the ground layer is required to be about 0.05 times to 0.1 times the wavelength in the air in order to obtain a sufficient radiation efficiency.

Moreover, if a radio communication device for the 60-GHz band is considered, the thickness of each of the dielectric layers 201, 202 and 203 is set at 150 microns to 200 microns in this first embodiment. In this case, the interval between the microstrip line 205 for antenna feeding and the ground layer 206 is 150 microns to 200 microns, and therefore, the microstrip line 205 for antenna feeding can be regarded as transmission in the quasi-TEM mode at 60 GHz. Moreover, an interval between each conductor patch 204 and the ground layer 206 becomes 300 to 400 microns, the interval being 0.06 times to 0.08 times the wavelength in the air, meaning that sufficient radiation efficiency can be obtained. Moreover, an interval between the microstrip line 205 for antenna feeding and the microstrip lines 208a and 208b for the high-frequency circuit becomes 300 to 400 microns, meaning that a sufficient degree of coupling can be obtained via the slot hole 207. Furthermore, the dielectric multilayer substrate 220 has a sufficient total thickness of 450 to 600 microns, and therefore, a high-strength dielectric multilayer substrate can be obtained. The warp of the dielectric multilayer substrate is also small, and the substrate mounting reliability of the MMIC chips 209a and 209b is improved.

As described above, by separately forming the conductor patches, the antenna feeder line, the ground layer and the high-frequency circuit on the upper surface, the lower surface and between the layers, respectively, of the dielectric multilayer substrate 220, the efficiency of the antenna and the characteristics of the antenna feeder line can be independently optimized. Since the antenna is spatially separated from the high-frequency circuit by the ground layer, the mutual adverse influences of the antenna and the high-frequency circuit can be eliminated.

Therefore, the efficiency and directivity of the antenna can be improved, and the semiconductor chip mounting reliability can be improved with the substrate warp restrained.

(Second Embodiment)

Figure 3:
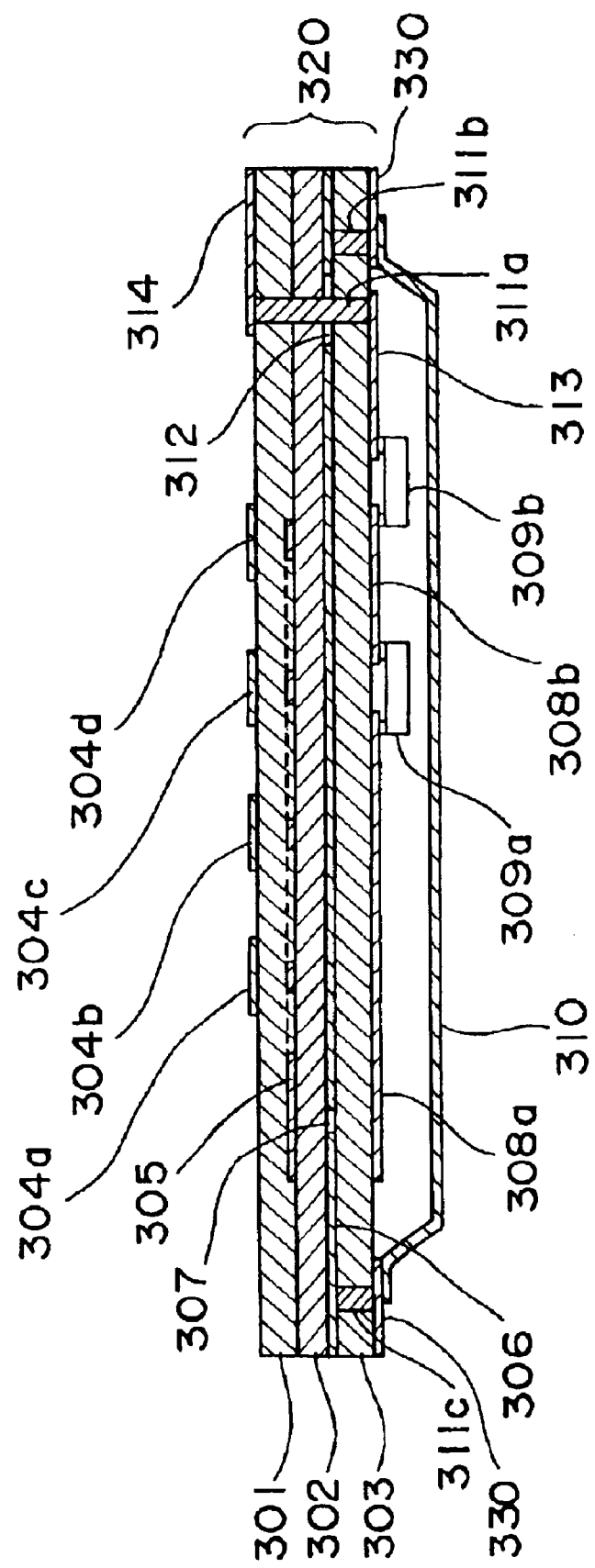
FIG. 3 is a sectional view of an antenna-integrated radio communication device according to a second embodiment of this invention.
Figure 4:
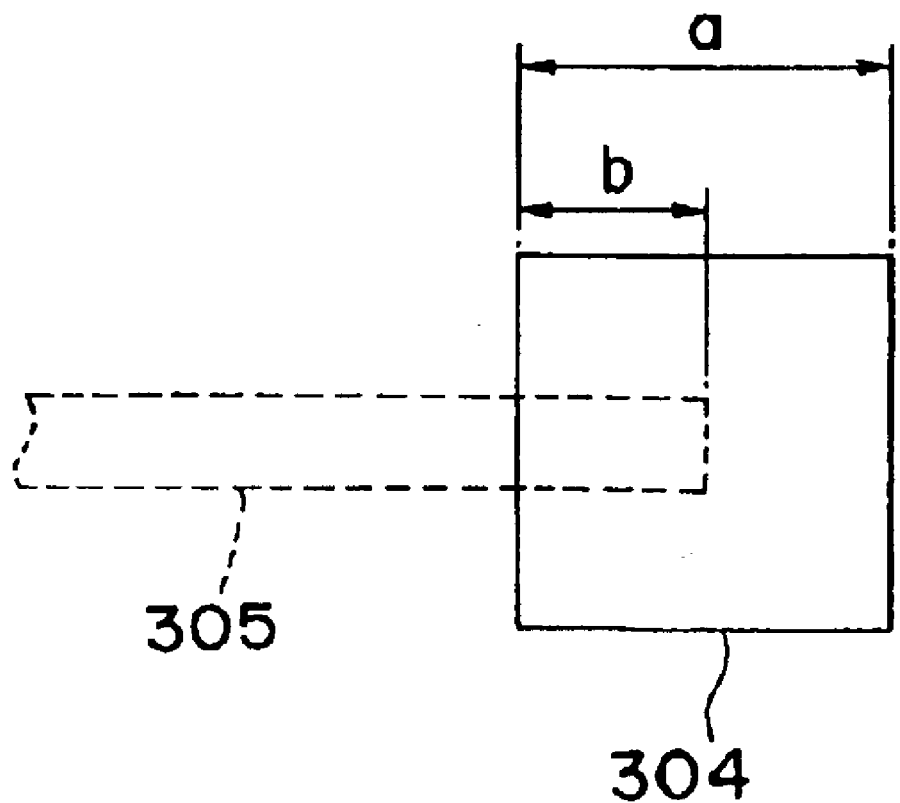
FIG. 4 is a top view of the antenna section of the above antenna-integrated radio communication device.

FIG. 3 is a sectional view showing the structure of the antenna-integrated radio communication device of the second embodiment of this invention, and FIG. 4 is a top view of the essential part of an antenna section.

As shown in FIG. 3, this antenna-integrated radio communication device includes a dielectric multilayer substrate 320 that has a first dielectric layer 301, a second dielectric layer 302 and a third dielectric layer 303, which are laminated together. A plurality of conductor patches 304a through 304d (only the four are shown in FIG. 3) are formed in an array form on the upper surface of the first dielectric layer 301, and a microstrip line 305 for antenna feeding is formed between the first dielectric layer 301 and the second dielectric layer 302. Moreover, a ground layer 306 is formed between the second dielectric layer 302 and the third dielectric layer 303, and a slot hole 307 is formed in the ground layer 306. Moreover, microstrip lines 308a and 308b for a high-frequency circuit are formed on the surface of the third dielectric layer 303, and MMIC's 309a and 309b, which are semiconductor chips, are mounted on the microstrip lines 308a and 308b for the high-frequency circuit. Then, the microstrip lines 308a and 308b for the high-frequency circuit and the MMIC's 309a and 309b are covered with a conductor lid 310.

Moreover, the ground layer 306 is connected to the conductor lid 310 via through holes 311b and 311c and a connection portion 330. Moreover, one end of a low-frequency signal line 313 is connected to the MMIC 309b, and a port 314 formed on the upper surface of the first dielectric layer 301 is connected to the other end of the low-frequency signal line 313 via a through hole 311a. A clearance hole 312 through which the through hole 311a penetrates is provided for the ground layer 306.

The microstrip line 305 for antenna feeding is electromagnetically coupled with the microstrip line 308a for the high-frequency circuit via the slot hole 307. Moreover, the microstrip line 305 for antenna feeding is electromagnetically coupled with the conductor patches 304 via the first dielectric layer 301.

The antenna-integrated radio communication device of the second embodiment has the same effect as that of the first embodiment.

Further, as shown in FIG. 4, one side "a" of the conductor patch 304 is set to about a half of the effective wavelength, and a length "b" in the lengthwise direction of the microstrip line 305 in the region where the microstrip line 305 for antenna feeding and the conductor patch 304 overlap each other is set to about a quarter of the effective wavelength.

Figure 5:
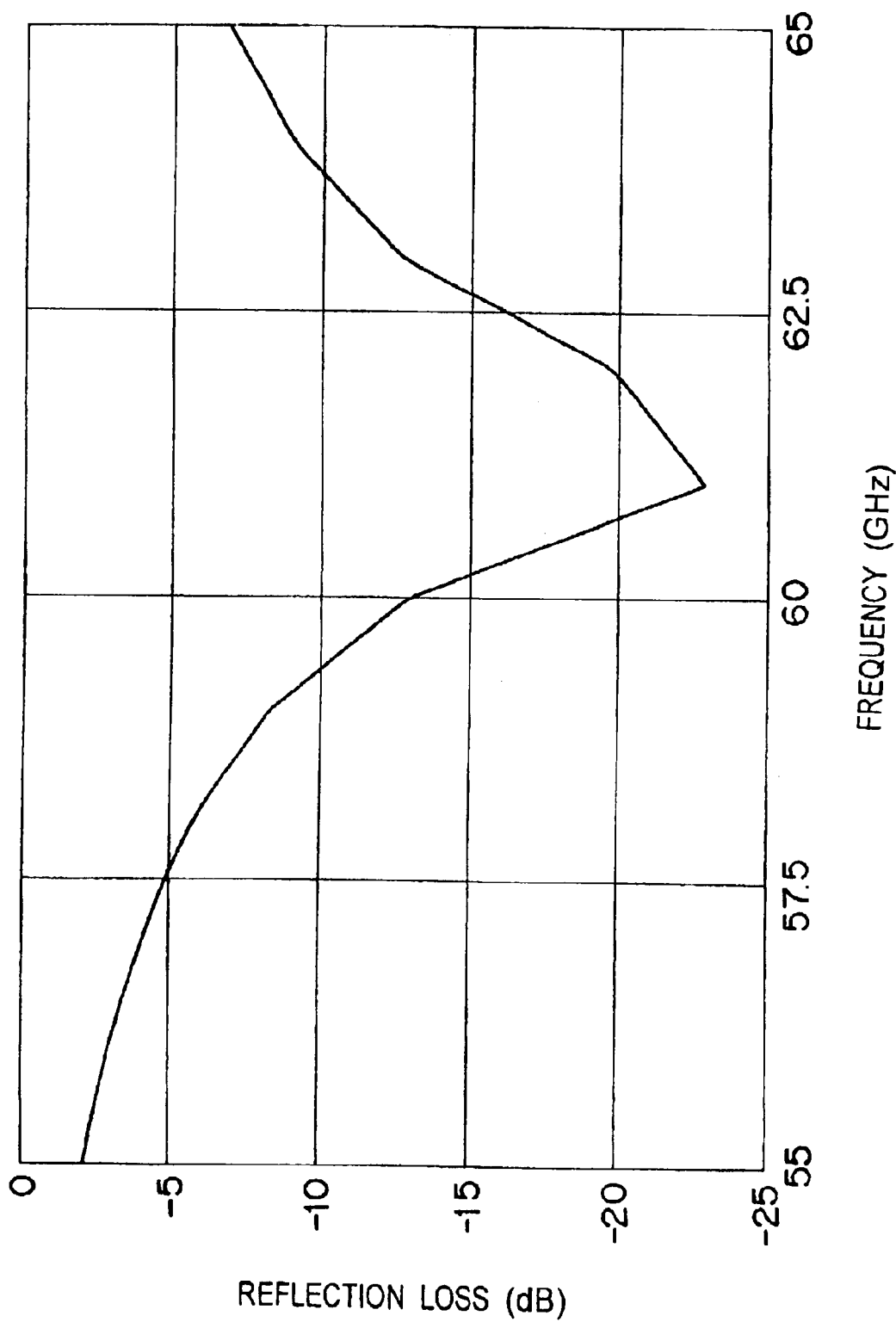
FIG. 5 is a graph showing the frequency dependence of the reflection loss of the antenna of the antenna-integrated radio communication device of the second embodiment of this invention.

FIG. 5 shows the reflection loss of the antenna section of the aforementioned antenna-integrated radio communication device. In FIG. 5, the horizontal axis represents the frequency, and the vertical axis represents the reflection loss. In this case, the dielectric layers are each an alumina substrate that has a thickness of 150 microns and a relative dielectric constant of 9. As shown in FIG. 5, the reflection loss is 10 dB or less at a frequency of 59 to 63 GHz. This means that the coupling of the microstrip line 305 for antenna feeding and the conductor patches 304a through 304d as well as the coupling of the conductor patches 304a through 304d and the space are satisfactory over a wide frequency band.

(Third Embodiment)

Figure 6:
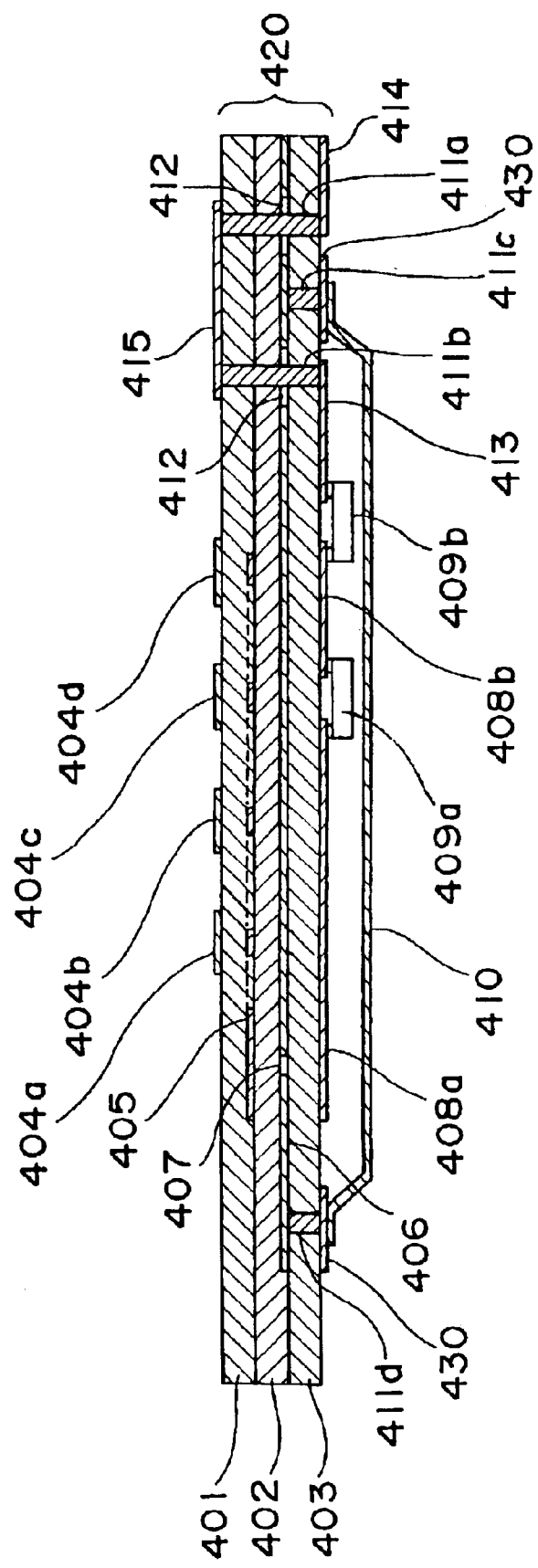
FIG. 6 is a sectional view of an antenna-integrated radio communication device according to a third embodiment of this invention.

FIG. 6 is a sectional view showing the structure of the antenna-integrated radio communication device of the third embodiment of this invention. As shown in FIG. 6, this antenna-integrated radio communication device includes a dielectric multilayer substrate 420 that has a first dielectric layer 401, a second dielectric layer 402 and a third dielectric layer 403, which are laminated together. A plurality of conductor patches 404a through 404d (only the four are shown in FIG. 6) are formed in an array form on the upper surface of the first dielectric layer 401, and a microstrip line 405 for antenna feeding is formed between the first dielectric layer 401 and the second dielectric layer 402. Moreover, a ground layer 406 is formed between the second dielectric layer 402 and the third dielectric layer 403, and a slot hole 407 is formed in the ground layer 406. Moreover, microstrip lines 408a and 408b for a high-frequency circuit are formed on the surface of the third dielectric layer 403, and MMIC's 409a and 409b, which are semiconductor chips, are mounted on the microstrip lines 408a and 408b for the high-frequency circuit. Then, the microstrip lines 408a and 408b for the high-frequency circuit and the MMIC's 409a and 409b are covered with a conductor lid 410.

Moreover, the ground layer 406 is connected to the conductor lid 410 via through holes 411c and 411d and a connection portion 430. One end of a low-frequency signal line 413 is connected to the MMIC 409b, and one end of a line 415 formed on the upper surface of the first dielectric layer 401 is connected to the other end of the low-frequency signal line 413 via the through hole 411b. Then, a port 414 formed on the surface of the third dielectric layer 403 is connected to the other end of the line 415 via the through hole 411a. A clearance hole 412 through which the through hole 411a penetrates is provided for the ground layer 406.

The microstrip line 405 for antenna feeding is electromagnetically coupled with the microstrip line 408a for the high-frequency circuit via the slot hole 407 opened on the ground layer 406. Moreover, the microstrip line 405 for antenna feeding is electromagnetically coupled with the conductor patches 404 via the first dielectric layer 401.

The antenna-integrated radio communication device of the third embodiment has the same effect as that of the first embodiment.

Moreover, this third embodiment differs from the first embodiment in that the port 414 of the low-frequency signal is provided on the lower surface of the dielectric multilayer substrate 420 and connected to the low-frequency signal line 413 located inside the conductor lid 410 via the through hole 411a, the line 415 and the through hole 411b. With this structure, an external device can be connected on the lower surface side of the dielectric multilayer substrate 420, and therefore, the radiation pattern of the antenna is not disordered. In FIG. 6, the port 414 of the low-frequency signal is arranged on the lower surface of the dielectric multilayer substrate 420. However, in the case of a DC bias line of MMIC, it is also possible to arrange the port of the DC bias line on the lower surface of the dielectric multilayer substrate utterly in a similar manner.

(Fourth Embodiment)

Figure 7:
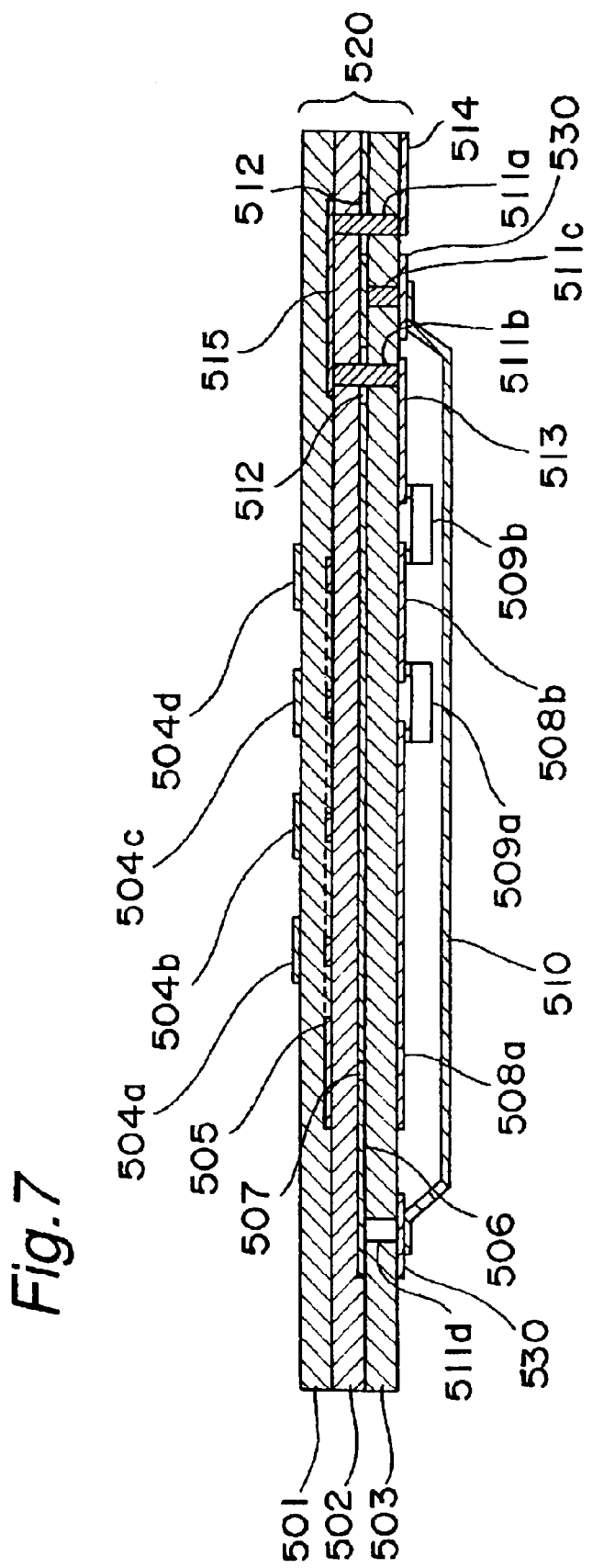
FIG. 7 is a sectional view of an antenna-integrated radio communication device according to a fourth embodiment of this invention.
Figure 8:
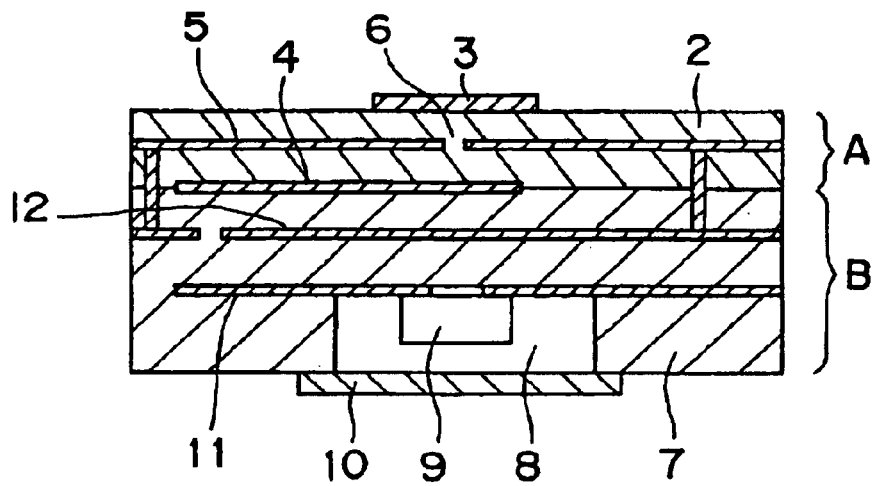
FIG. 8 is a sectional view of a prior art antenna-integrated radio communication device.
Figure 9:
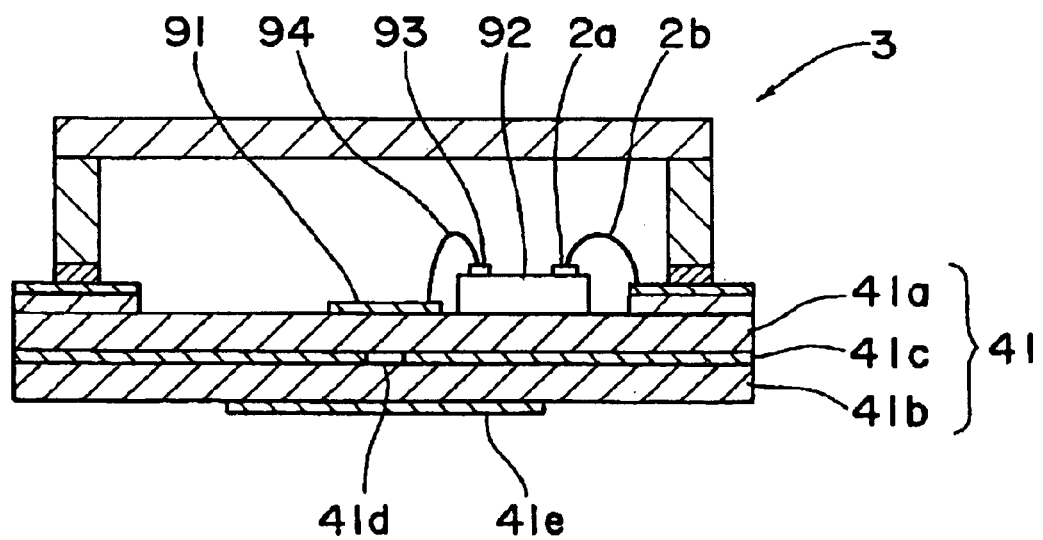
FIG. 9 is a sectional view of another prior art antenna-integrated radio communication device.

FIG. 7 is a sectional view showing the structure of the antenna-integrated radio communication device of the fourth embodiment of this invention. As shown in FIG. 7, this antenna-integrated radio communication device includes a dielectric multilayer substrate 520 that has a first dielectric layer 501, a second dielectric layer 502 and a third dielectric layer 503, which are laminated together. A plurality of conductor patches 504a through 504d (only the four are shown in FIG. 7) are formed in an array form on the upper surface of the first dielectric layer 501. Moreover, a microstrip line 505 for antenna feeding is formed between the first dielectric layer 501 and the second dielectric layer 502. Moreover, a ground layer 506 is formed between the second dielectric layer 502 and the third dielectric layer 503, and a slot hole 507 is formed in the ground layer 506. Moreover, microstrip lines 508a and 508b for a high-frequency circuit are formed on the surface of the third dielectric layer 503, and MMIC's 509a and 509b, which are semiconductor chips, are mounted on the microstrip lines 508a and 508b for the high-frequency circuit. Then, the microstrip lines 508a and 508b for the high-frequency circuit and the MMIC's 509a and 509b are covered with a conductor lid 510.

Moreover, the ground layer 506 is connected to the conductor lid 510 via through holes 511c and 511d and a connection portion 530. Moreover, one end of a low-frequency signal line 513 is connected to the MMIC 509b, and one end of a line 515 formed between the first dielectric layer 501 and the second dielectric layer 502 is connected to the other end of the low-frequency signal line 513 via the through hole 511b. Then, a port 514 formed on the surface of the third dielectric layer 503 is connected to the other end of the line 515 via the through hole 511a. A clearance hole 512 through which the through hole 511a penetrates is provided for the ground layer 506.

The microstrip line 505 for antenna feeding is electromagnetically coupled with the microstrip line 405a for the high-frequency circuit via the slot hole 507. Moreover, the microstrip line 505 for antenna feeding is electromagnetically coupled with the conductor patches 504 via the first dielectric layer 501.

The antenna-integrated radio communication device of the fourth embodiment has the same effect as that of the third embodiment.

This fourth embodiment differs from the third embodiment in that the port 514 of the low-frequency signal is connected to the low-frequency signal line 513 located inside the conductor lid 510 via the line 515 of the internal layer (located between the first and second dielectric layers 501 and 502) of the dielectric multilayer substrate 520. With this structure, the line 515 for the low-frequency signal is arranged inside the dielectric multilayer substrate 520 with respect to the conductor patches 504a through 504d, and therefore, the radiation pattern is not disordered by the signal line. In FIG. 7, the port of the low-frequency signal is arranged on the lower surface side of the dielectric multilayer substrate 520. However, in the case of a DC bias line of MMIC, it is also possible to arrange the port of the DC bias line on the lower surface side of the dielectric multilayer substrate utterly in a similar manner.

In the first through fourth embodiments, by obtaining the dielectric layers of the dielectric multilayer substrates 220, 320, 420 and 520 by integrally baking a ceramic material that has a relative dielectric constant of 4 to 10, the structure of the dielectric multilayer substrate can be accurately obtained. Furthermore, by virtue of the use of the ceramic material, a strong substrate strength can be obtained, restraining the substrate warp and allowing the semiconductor chip mounting reliability to be improved.

(Fifth Embodiment)

Figure 10:
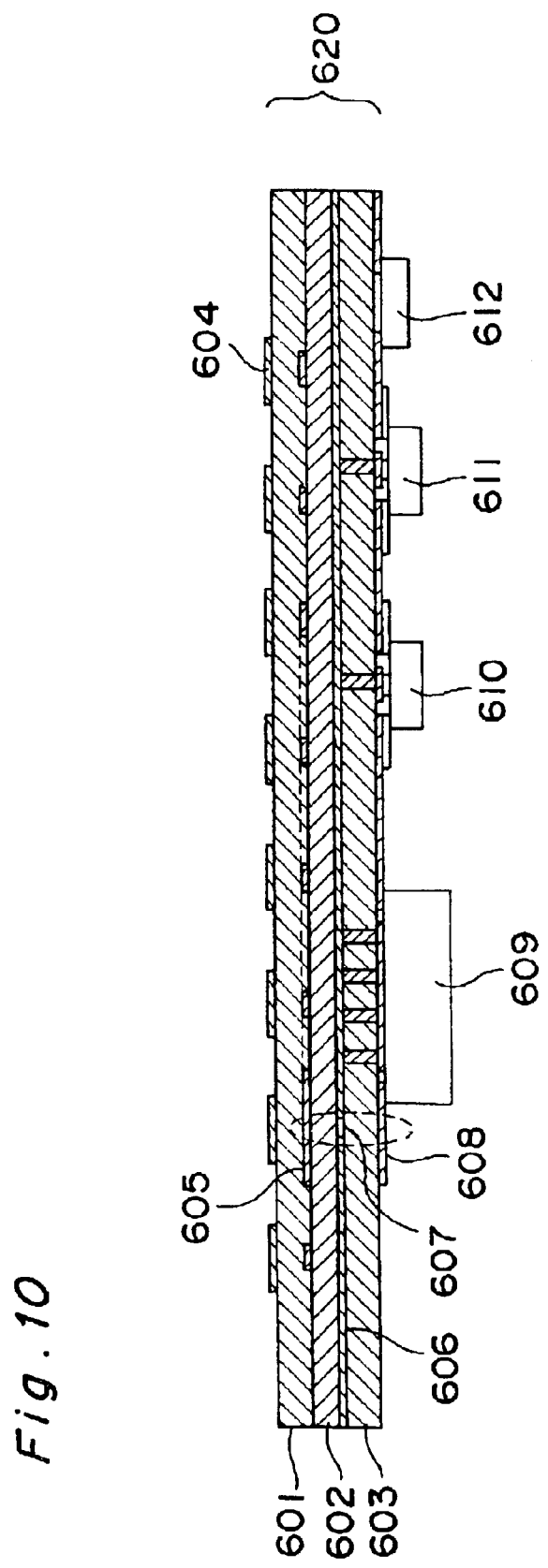
FIG. 10 is a sectional view of an antenna-integrated radio communication device according to a fifth embodiment of this invention.

FIG. 10 is a sectional view showing the structure of the antenna-integrated radio communication device of the fifth embodiment of this invention. The antenna-integrated radio communication device having an antenna section that employs 64-element conductor patches will be described below.

As shown in FIG. 10, the antenna-integrated radio communication device includes a dielectric multilayer substrate 620 that has a first dielectric layer 601, a second dielectric layer 602 and a third dielectric layer 603, which are laminated together. In this case, glass ceramic having a dielectric constant of 5.7, a dielectric loss tangent of 0.0019 and a layer thickness of 150 microns is used as a dielectric substance for the first through third dielectric layers 601, 602 and 603. Conductor patches 604 and so on are formed in an array form on the upper surface of the first dielectric layer 601. One element of the conductor patches 604 has a dimension of 1.18 mm×0.84 mm. Moreover, a microstrip line 605 for antenna feeding is formed between the first dielectric layer 601 and the second dielectric layer 602. The conductor patches 604 and the microstrip line 605 for antenna feeding constitute an antenna section. Moreover, a ground layer 606 is formed between the second dielectric layer 602 and the third dielectric layer 603, and a slot hole 607 is formed in the ground layer 606. Moreover, a high-frequency microstrip line 608 is formed on the surface of the third dielectric layer 603, and surface mounting type components such as a millimeter wave package 609, package transistors 610 and 611 and a chip capacitor 612 are mounted on the high-frequency microstrip line 608 by soldering. Although not shown, a millimeter wave amplifier MMIC, a millimeter wave filter, a millimeter wave mixer MMIC and so on are mounted inside the millimeter wave package 609 by wire bonding or similar means.

Figure 11:
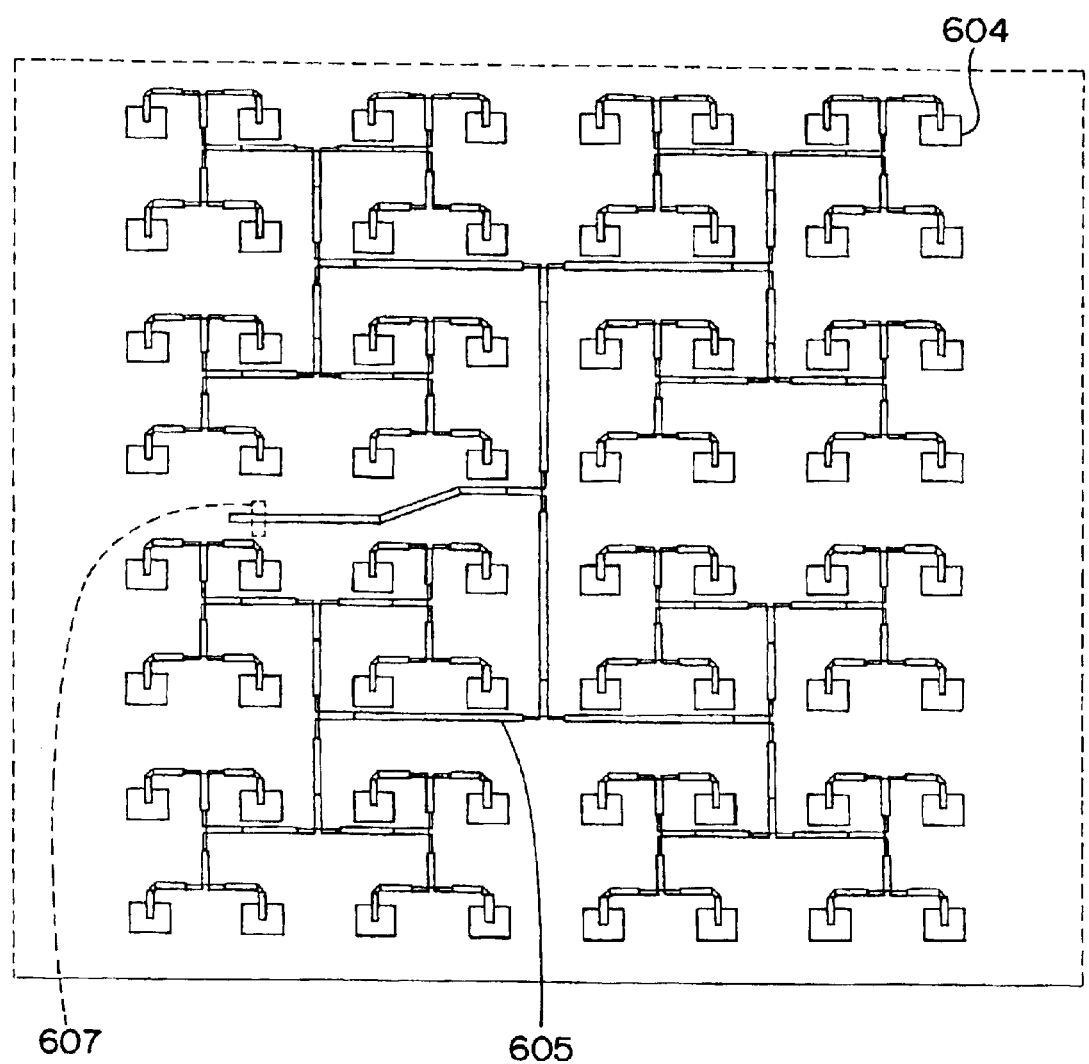
FIG. 11 is a view showing the positional relation of conductor patches, an antenna feeding microstrip line and a slot hole of the above antenna-integrated radio communication device.

FIG. 11 shows the positional relation of the conductor patches 604, the microstrip line 605 for antenna feeding and the slot hole 607. An interval between the conductor patches 604 is 3.2 mm, which corresponds to 0.64λ0. In this case, λ0 has a free space wavelength of about 5 mm at 60 GHz.

Figure 12:
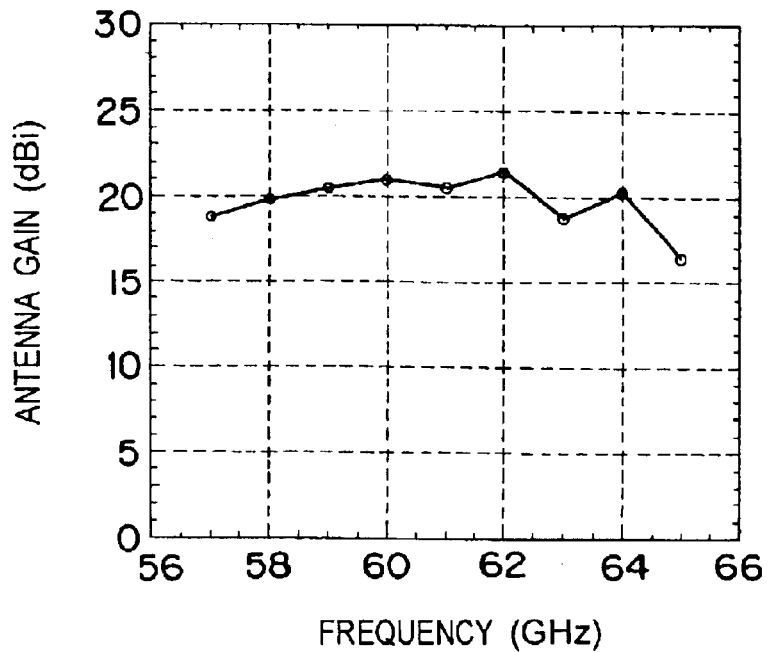
FIG. 12 is a graph showing the frequency characteristic of the antenna gain of the antenna section of the above antenna-integrated radio communication device.
Figure 13:
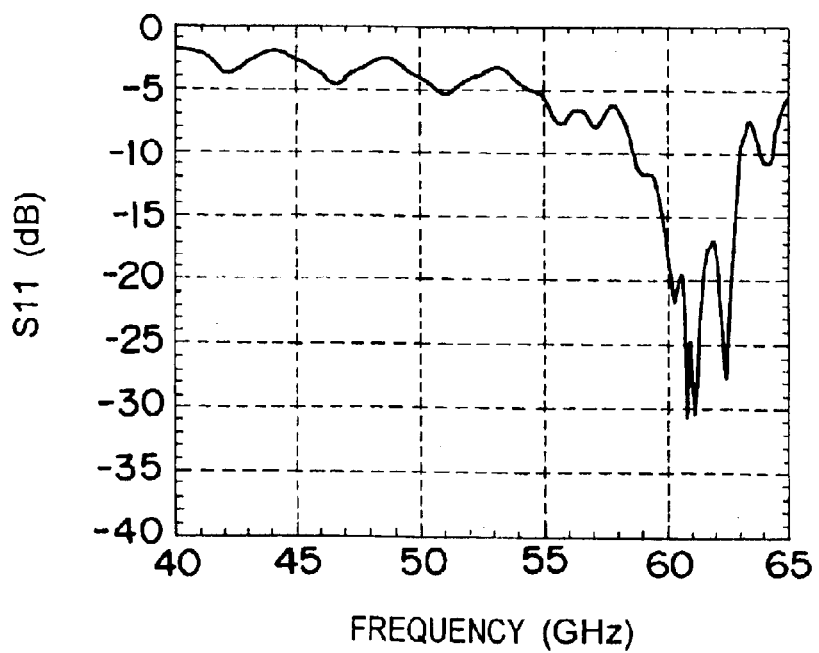
FIG. 13 is a graph showing the frequency characteristic of the input reflection loss of the above antenna section.
Figure 14:
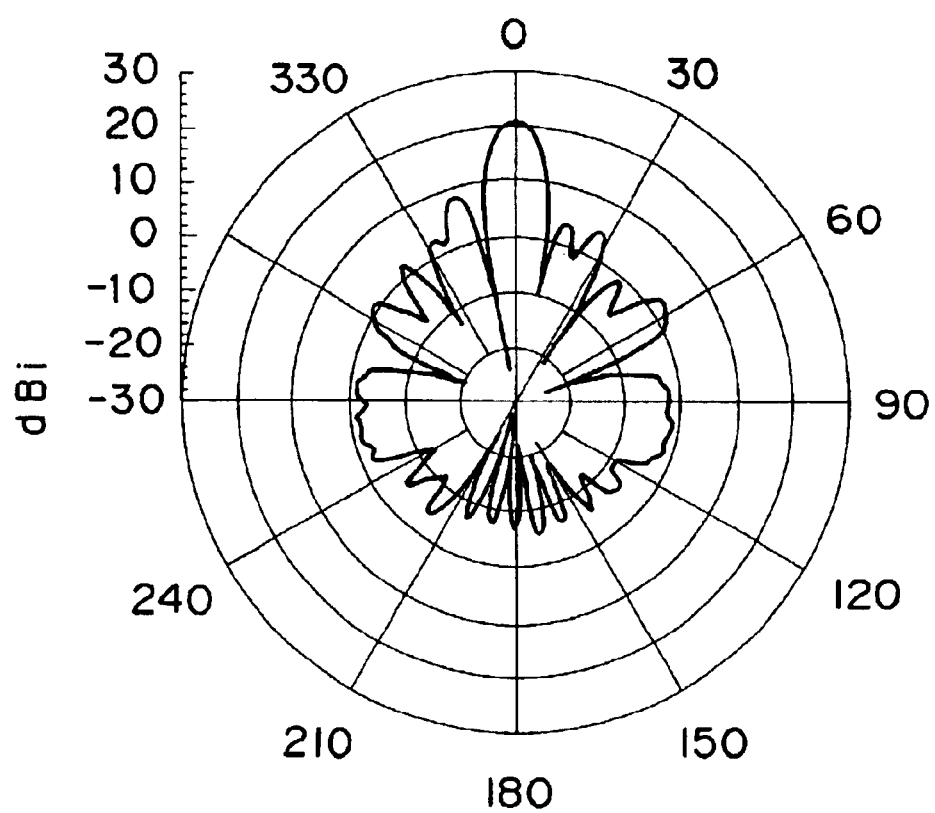
FIG. 14 is a view showing the radiation pattern at 60 GHz of the above antenna section.

FIG. 12 through FIG. 14 show the characteristics of the antenna section that employs the aforementioned 64-element conductor patches. That is, FIG. 12 shows the frequency characteristic of the antenna gain of the antenna section. The horizontal axis represents the frequency, and the vertical axis represents the antenna gain. FIG. 13 shows the frequency characteristic of the input reflection loss S11 of the antenna section. The horizontal axis represents the frequency, and the vertical axis represents the input reflection loss S11. FIG. 14 shows the radiation pattern of the above-mentioned antenna at 60 GHz. The characteristics shown in FIG. 12 through FIG. 14 indicate that the antenna gain is about 20 dBi and the input reflection loss characteristic is 10 dB or more over the wide band of about 59 GHz to 63 GHz, meaning that the antenna section satisfactorily operates.

As described above, the circuit of a frequency of not higher than 30 GHz is formed of inexpensive package transistors and so on, while the circuit of the millimeter waves at 60 GHz or the like, at which the loss at the connection portion becomes a problem, is mounted inside the millimeter wave package with MMIC's and mounted on the surface of the dielectric multilayer substrate. With the above-mentioned structure, the cost of the antenna-integrated radio communication device can be reduced. Moreover, since the ceramic material such as glass ceramic is used for the dielectric multilayer substrate, there is a little deformation due to heat, and the high mounting reliability of the surface mounting components can be obtained.

Moreover, in the sixth embodiment, the first through third dielectric layers 601, 602 and 603 have a thickness of 150 microns. However, by setting the thickness of each layer to 100 microns to 200 microns, satisfactory transmission characteristics of the antenna feeding microstrip line can be obtained.

(Sixth Embodiment)

Figure 15:
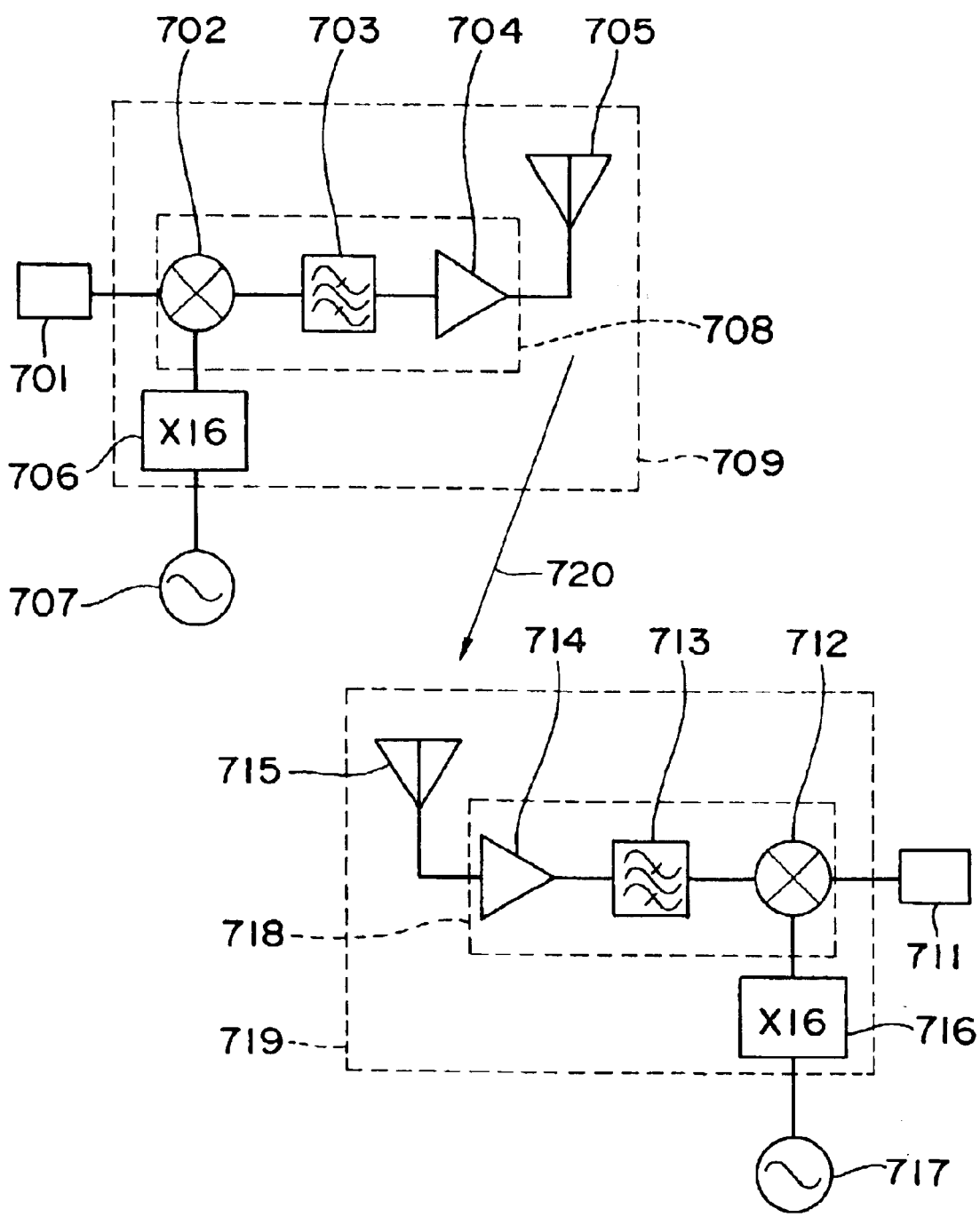
FIG. 15 is a block diagram showing the constructions of a transmitter and a receiver, each of which employs an antenna-integrated radio communication device according to a sixth embodiment of this invention.

FIG. 15 is a block diagram showing the construction of a transmitter and a receiver, which employ the antenna-integrated radio communication device of the sixth embodiment of this invention. In FIG. 15, the transmitter is constructed of a modulation signal source 701, an even higher harmonic mixer 702, a bandpass filter 703, a power amplifier 704, an antenna 705, a 16× multiplier 706 and a reference signal source 707. In this case, the modulation signal source 701 is to output images and data and outputs, for example, an intermediate frequency signal of a broadcasting satellite and a communications satellite. On the other hand, the receiver is constructed of a tuner 711, an even higher harmonic mixer 712, a bandpass filter 713, a low-noise amplifier 714, an antenna 715, a 16× multiplier 716 and a reference signal source 717.

The even higher harmonic mixer 702, the bandpass filter 703 and the power amplifier 704 of the transmitter are housed in a millimeter wave package 708, while the even higher harmonic mixer 712, the bandpass filter 713 and the low-noise amplifier 714 are housed in a millimeter wave package 718 of the receiver. The millimeter wave packages 708 and 718 correspond to the millimeter wave package 609 shown in FIG. 10, while the antennas 705 and 715 correspond to the 64-element antenna shown in FIG. 11. Moreover, the 16× multipliers 706 and 716 are formed of package transistors, chip capacitors, chip resistors, microstrip lines and the like on the surface of the third dielectric layer as shown in FIG. 10.

In the transmitter of the above-mentioned construction, an intermediate-frequency signal generated by the modulation signal source 701 occupies the frequencies of 1 GHz to 3 GHz and is inputted to the intermediate-frequency signal terminal of the even higher harmonic mixer 702. Moreover, a sine-wave signal at a frequency of 1.84375 GHz generated by the reference signal source 707 becomes a local oscillation signal of a 29.5-GHz sine wave obtained by multiplying the frequency by sixteen times by the 16× multiplier 706 and inputted to the local oscillation signal terminal of the even higher harmonic mixer 702. Then, the intermediate-frequency signal is mixed with the local oscillation signal in the even higher harmonic mixer 702. Among the signals generated from the even higher harmonic mixer 702, only the high-frequency signals within the frequency range of 60 GHz to 62 GHz pass through the bandpass filter 703 and is inputted to and amplified by the power amplifier 704 and radiated as high-frequency radio waves 720 from the antenna 705.

Then, the high-frequency radio waves 720 radiated from the antenna 705 of the transmitter are received by the antenna 715 of the receiver so as to become a high-frequency signal and amplified by the low-noise amplifier 714. Further, the high-frequency signal amplified by the low-noise amplifier 714 passes through the bandpass filter 713 and is inputted to the high-frequency signal terminal of the even higher harmonic mixer 712. The sine-wave signal, which is generated by the reference signal source 717 and the 16× multiplier 716 and has a frequency of 29.5 GHz, is inputted to the local oscillation signal terminal of the even higher harmonic mixer 712 similarly to the aforementioned transmitter. Then, the inputted high-frequency signal is mixed with a local oscillation signal inside the even higher harmonic mixer 712 and reconverted into an intermediate-frequency signal within the frequency range of 1 GHz to 3 GHz. The intermediate-frequency signal converted by the even higher harmonic mixer 712 is inputted to the tuner 711 and converted into the desired information by the tuner 711.

The antenna 705 and the antenna 715 may have same construction, while the 16× multiplier 706 and the 16× multiplier 716 may have same construction. That is, portions other than the millimeter wave package of the antenna-integrated radio communication device may be shared by the transmitter and the receiver.

As described above, by constructing a transmitter and a receiver with the antenna-integrated radio communication device of this invention, the transmitter and the receiver can be downsized. Moreover, by virtue of the formation of the antenna section and the high-frequency circuit on the upper and lower surfaces, respectively, of the dielectric substrate, it is allowed to reduce the transmission loss of the signal between the antenna section and the high-frequency circuit and increase the communication distance without increasing consumption power.

What is claimed is:

1. An antenna-integrated radio communication device having a dielectric multilayer substrate in which a plurality of dielectric layers are laminated and a high-frequency circuit on which semiconductor chips are mounted, wherein a plurality of conductor patches, an antenna feeder line for feeding the plurality of conductor patches, one ground layer and the high-frequency circuit connected to the antenna feeder line are separately arranged on an upper surface, between layers and on a lower surface, respectively, of the dielectric multilayer substrate, and the one ground layer is arranged between an antenna section, comprised of the plurality of conductor patches and the antenna feeder line, and the high-frequency circuit.

2. The antenna-integrated radio communication device as claimed in claim 1, wherein the dielectric multilayer substrate is a dielectric multilayer substrate comprised of a first dielectric layer, a second dielectric layer and a third dielectric layer, the plurality of conductor patches are arranged on an upper surface of the first dielectric layer of the dielectric multilayer substrate, the antenna feeder line is arranged between the first dielectric layer and the second dielectric layer, the ground layer is arranged between the second dielectric layer and the third dielectric layer, the high-frequency circuit is arranged on a lower surface of the third dielectric layer of the dielectric multilayer substrate, and the antenna feeder line is electromagnetically coupled with the high-frequency circuit via a slot hole provided for the ground layer.

3. The antenna-integrated radio communication device as claimed in claim 1, wherein the plurality of conductor patches are arranged in an array form, the antenna feeder line is branched into a plurality of lines, and the plurality of conductor patches and end portions of the branches of the antenna feeder line overlap each other.

4. The antenna-integrated radio communication device as claimed in claim 3, wherein a distance in a lengthwise direction of the antenna feeder line in a region where the plurality of conductor patches and the end portions of the branches of the antenna feeder line overlap each other is approximately a quarter of an effective wavelength of a prescribed electromagnetic wave.

5. The antenna-integrated radio communication device as claimed in claim 1, wherein the dielectric layers of the dielectric multilayer substrate are formed by integrally baking a ceramic material that has a relative dielectric constant of 4 to 10.

6. An antenna-integrated radio communication device, wherein a plurality of conductor patches, an antenna feeder line, a ground layer and a high-frequency circuit are provided in order from an upper surface to a lower surface of a dielectric multilayer substrate on the upper surface, between layers and on the lower surface, respectively, of the dielectric multilayer substrate in which three dielectric layers are laminated.

7. The antenna-integrated radio communication device as claimed in claim 6, wherein each dielectric layer of the dielectric multilayer substrate has a thickness of 100 microns to 200 microns.

8. A transmitter employing the antenna-integrated radio communication device claimed in claim 6, wherein said high-frequency circuit comprises an up-converter package.

9. A receiver employing the antenna-integrated radio communication device claimed in claim 6, wherein said high-frequency circuit comprises a down-converter package.

10. The antenna-integrated radio communication device as claimed in claim 6, wherein the antenna feeder line is electromagnetically coupled with the high-frequency circuit via a slot hole formed in the ground layer.

* * * * *